(12) United States Patent
Van Wageningen et al.

(10) Patent No.: US 11,424,645 B2
(45) Date of Patent: Aug. 23, 2022

(54) FOREIGN OBJECT DETECTION IN A WIRELESS POWER TRANSFER SYSTEM

(71) Applicant: KONINKLIJKE PHILIPS N.V., Eindhoven (NL)

(72) Inventors: Andries Van Wageningen, Wijlre (NL); Antonius Adriaan Maria Staring, Eindhoven (NL); Wilhelmus Gerardus Maria Ettes, Leeuwarden (NL); Petrus Carolus Maria Frissen, Beek (NL); Aditya Mehendale, Geldrop (NL); Willem Potze, Geldrop (NL)

(73) Assignee: Koninklijke Philips N.V., Eindhoven (NL)

( * ) Notice: Subject to any disclaimer, the term of this patent is extended or adjusted under 35 U.S.C. 154(b) by 954 days.

(21) Appl. No.: 16/097,656

(22) PCT Filed: May 2, 2017

(86) PCT No.: PCT/EP2017/060319
§ 371 (c)(1),
(2) Date: Oct. 30, 2018

(87) PCT Pub. No.: WO2017/194338
PCT Pub. Date: Nov. 16, 2017

(65) Prior Publication Data
US 2020/0328616 A1  Oct. 15, 2020

(30) Foreign Application Priority Data
May 10, 2016  (EP) .................................... 16168995

(51) Int. Cl.
*H02J 50/60* (2016.01)
*H02J 50/12* (2016.01)
(Continued)

(52) U.S. Cl.
CPC .......... *H02J 50/12* (2016.02); *G01R 27/2611* (2013.01); *G01R 31/42* (2013.01); *H02J 50/60* (2016.02)

(58) Field of Classification Search
CPC .......... H02J 50/12; H02J 50/60; H02J 50/005; H02J 50/10; G01R 27/2611; G01R 31/42
See application file for complete search history.

(56) References Cited

U.S. PATENT DOCUMENTS 8,569,666 B2   10/2013  Gutierrez et al.
9,178,361 B2   11/2015  Liu et al.
(Continued)

FOREIGN PATENT DOCUMENTS

DE  202009009693 A1  12/2010
DE  102014207427 A1  10/2015
(Continued)

OTHER PUBLICATIONS

Wireless Power Consortium, Accessed Oct. 30, 2018, https://www.wirelesspowerconsortium.com/index.html.

*Primary Examiner* — Daniel Cavallari

(57) ABSTRACT

A wireless power transfer system includes a power receiver (105) receiving a power transfer from a power transmitter (101) via a wireless inductive power transfer signal. The power transmitter (101) comprises a transmit power coil (103) generating the power transfer signal. A test signal coil (209) coupled to a test signal generator (211) generates a magnetic test signal. A plurality of spatially distributed detection coils (213) is coupled to measurement unit (215) generating a set of measurement values reflecting signals induced in the detection coils (213) by the magnetic test signal. A processor (217) determines a measurement spatial distribution of the measurement value where the spatial distribution reflects positions of the detection coils (213). A foreign object detector (219) detects a presence of a foreign (Continued)

object in response to a comparison of the measurement spatial distribution to a reference spatial distribution. The foreign object detector (219) is arranged to determine the reference spatial distribution in response to data received from the power receiving device (105).

15 Claims, 6 Drawing Sheets

(51) Int. Cl.
    *G01R 27/26*      (2006.01)
    *G01R 31/42*      (2006.01)

(56) References Cited

U.S. PATENT DOCUMENTS

| | | |
|---|---|---|
| 2013/0241300 A1 | 9/2013 | Miyamoto |
| 2014/0158680 A1 | 6/2014 | Kitaizumi et al. |
| 2014/0159503 A1* | 6/2014 | Murakami .............. G01V 3/08 307/104 |
| 2014/0218036 A1 | 8/2014 | Fry |
| 2015/0109000 A1 | 4/2015 | Sieber et al. |
| 2016/0006260 A1 | 1/2016 | Nakamura et al. |
| 2016/0336760 A1* | 11/2016 | Yamamoto .............. H02J 50/12 |

FOREIGN PATENT DOCUMENTS

| | | |
|---|---|---|
| EP | 2879140 A1 | 6/2015 |
| GB | 2508923 A | 6/2014 |
| JP | 02855929 B2 | 2/1999 |
| JP | 2011120425 A | 6/2011 |
| JP | 2013062180 A | 4/2013 |
| JP | 2015159690 A | 9/2015 |
| JP | 2016054596 A | 4/2016 |
| WO | 2007107888 A2 | 9/2007 |
| WO | 2014129181 A1 | 8/2014 |
| WO | 2015165703 A1 | 11/2015 |
| WO | 2016010493 A1 | 1/2016 |

* cited by examiner

FOREIGN OBJECT DETECTION IN A WIRELESS POWER TRANSFER SYSTEM

CROSS-REFERENCE TO PRIOR APPLICATIONS

This application is the U.S. National Phase application under 35 U.S.C. § 371 of International Application No. PCT/EP2017/060319, filed on 2 May 2017, which claims the benefit of European Patent Application No. 16168995.5, filed on 10 May 2016. These applications are hereby incorporated by reference herein.

FIELD OF THE INVENTION

The invention relates to foreign object detection in an inductive power transfer system and in particular, but not exclusively, to foreign object detection for a power transmitter providing inductive power transfer using elements compatible with the Qi Specifications for wireless power transfer systems.

BACKGROUND OF THE INVENTION

Most present day systems require a dedicated electrical contact in order to be powered from an external power supply. However, this tends to be impractical and requires the user to physically insert connectors or otherwise establish a physical electrical contact. Typically, power requirements also differ significantly, and currently most devices are provided with their own dedicated power supply resulting in a typical user having a large number of different power supplies with each power supply being dedicated to a specific device. Although, the use of internal batteries may avoid the need for a wired connection to a power supply during use, this only provides a partial solution as the batteries will need recharging (or replacing). The use of batteries may also add substantially to the weight and potentially cost and size of the devices.

In order to provide a significantly improved user experience, it has been proposed to use a wireless power supply wherein power is inductively transferred from a transmitter inductor in a power transmitter device to a receiver coil in the individual devices.

Power transmission via magnetic induction is a well-known concept, mostly applied in transformers having a tight coupling between a primary transmitter inductor and a secondary receiver coil. By separating the primary transmitter inductor and the secondary receiver coil between two devices, wireless power transfer between these becomes possible based on the principle of a loosely coupled transformer.

Such an arrangement allows a wireless power transfer to the device without requiring any wires or physical electrical connections to be made. Indeed, it may simply allow a device to be placed adjacent to, or on top of, the transmitter inductor in order to be recharged or powered externally. For example, power transmitter devices may be arranged with a horizontal surface on which a device can simply be placed in order to be powered.

Furthermore, such wireless power transfer arrangements may advantageously be designed such that the power transmitter device can be used with a range of power receiver devices. In particular, a wireless power transfer approach, known as the Qi Specifications, has been defined and is currently being developed further. This approach allows power transmitter devices that meet the Qi Specifications to be used with power receiver devices that also meet the Qi Specifications without these having to be from the same manufacturer or having to be dedicated to each other. The Qi standard further includes some functionality for allowing the operation to be adapted to the specific power receiver device (e.g. dependent on the specific power drain).

The Qi Specification is developed by the Wireless Power Consortium and more information can e.g. be found on their website: http://www.wirelesspowerconsortium.com/index-.html, where in particular the defined Specification documents can be found.

A potential problem with wireless power transfer is that power may unintentionally be transferred to e.g. metallic objects that happen to be in the vicinity of the power transmitter. For example, if a foreign object, such as e.g. a coin, key, ring etc., is placed upon the power transmitter platform arranged to receive a power receiver, the magnetic flux generated by the transmitter coil will introduce eddy currents in the metal objects which will cause the objects to heat up. The heat increase may be very significant and may be highly disadvantageous.

In order to reduce the risk of such scenarios arising, it has been proposed to introduce foreign object detection where the power transmitter can detect the presence of a foreign object and reduce the transmit power and/or generate a user alert when a positive detection occurs. For example, the Qi system includes functionality for detecting a foreign object, and for reducing power if a foreign object is detected. Specifically, Qi specification version 1.2.1, section 11 describes various methods of detecting a foreign object.

One method to detect such foreign objects is by determining unaccounted for power losses, as e.g. disclosed in WO 2012127335. Both the power receiver and the power transmitter measure their power, and the receiver communicates its measured received power to the power transmitter. When the power transmitter detects a significant difference between the power sent by the transmitter and the power received by the receiver, an unwanted foreign object may potentially be present, and the power transfer may be reduced or aborted for safety reasons. This power loss method requires synchronized accurate power measurements performed by the power transmitter and the power receiver.

For example, in the Qi power transfer standard, the power receiver estimates its received power e.g. by measuring the rectified voltage and current, multiplying them and adding an estimate of the internal power losses in the power receiver (e.g. losses of the rectifier, the receive coil, metal parts being part of the receiver etc.). The power receiver reports the determined received power to the power transmitter with a minimum rate of e.g. every four seconds.

The power transmitter estimates its transmitted power, e.g. by measuring the DC input voltage and current of the inverter, multiplying them and correcting the result by subtracting an estimation of the internal power losses in the transmitter, such as e.g. the estimated power loss in the inverter, the primary coil and metal parts that are part of the power transmitter.

The power transmitter can estimate the power loss by subtracting the reported received power from the transmitted power. If the difference exceeds a threshold, the transmitter will assume that too much power is dissipated in a foreign object, and it can then proceed to terminate the power transfer.

Alternatively, it has been proposed to measure the quality or Q-factor of the resonant circuit formed by the primary and secondary coils together with the corresponding capacitances and resistances. A reduction in the measured Q-factor may be indicative of a foreign object being present.

In practice, it tends to be difficult to achieve sufficient detection accuracy using the methods described in the Qi specification. This difficulty is exacerbated by a number of uncertainties about the specific current operating conditions.

For example, a particular problem is the potential presence of friendly metals (i.e. metal parts of the device that contains the power receiver) as the magnetic and electrical properties of these may be unknown and therefore may be difficult to compensate for. Moreover, the spatial alignment between the power receiver and the power transmitter is typically not known and this may substantially affect the measured values. Also, the lateral extension of the generated magnetic field is typically not known, and may vary substantially between different power transmitters.

Further, undesirable heating may result from even relatively small amounts of power being dissipated in a metallic foreign object. Therefore, it is necessary to detect even a small power discrepancy between the transmitted and received power and this may be particularly difficult when the power levels of the power transfer increase.

The power estimates of both the power transmitter and the power receiver may typically have an accuracy of around ±1%. For a 15 W power receiver load, the received power is typically 16 W or more and therefore typical power estimates may in such an example have an uncertainty of around ±160 mW. Accordingly, the estimated power difference/loss will have an uncertainty of ±320 mW, spanning a range of 640 mW. Determining whether the true power loss is less than 500 mW thus becomes a difficult task.

The Q factor degradation approach may in many scenarios have a better sensitivity for detecting the presence of metal objects. However, it may still not provide sufficient accuracy and e.g. may also suffer from the influence of friendly metal.

The problems increase for increasing power levels and therefore the existing approaches may be less suitable for the higher power levels that are envisaged in the future.

Specifically, the uncertainty of the power loss estimate may increase substantially for higher power levels. However, detection is still required at the same absolute power levels (e.g. it may be required that a power loss of 500 mW (or less) in a foreign object must be detected).

Another issue is that higher power levels tend to require physically larger coils in order to effectively transfer the higher levels of power. For example, the coils in a Qi system for power levels of around 1 W . . . 30 W tend to have e.g. a diameter of approximately 20 mm . . . 60 mm whereas the coils in systems for power levels in the 200 W . . . 2 kW ranges will have a typical diameter of approximately 100 mm . . . 2500 mm. However, such larger coils impact the detection performance of both the power difference and Q degradation approaches. This is particularly the case for detection of smaller foreign objects, such as for example for detection of a small coin.

Another issue is that the power receiver may in some cases not be able to provide information on the received power, or may have characteristics that differentiate substantially from the nominal or expected power receiver. For example, the power receiver may be a power receiving device that uses the magnetic field for direct inductive heating. This would for example be the case for a device that heats up a metal plate by eddy currents induced by the power transfer signal e.g. in order to cook water or food. The friendly metal of such a device has an enormous influence on the measurements and at first glance makes it almost impossible to distinguish a foreign metal object from the friendly metal. Also, such power receivers may be very simple and may not comprise functionality for effectively measuring and reporting the received power to the power receiver.

Accordingly, current algorithms tend to be suboptimal and may in some scenarios and examples provide less than optimum performance. In particular, they may result in foreign objects that are present not being detected, or in false detections of foreign objects when none are present.

Hence, an improved object detection would be advantageous and in particular an approach allowing increased flexibility, reduced cost, reduced complexity, improved object detection, fewer false detections and missed detections, and/or improved performance would be advantageous.

SUMMARY OF THE INVENTION

Accordingly, the Invention seeks to preferably mitigate, alleviate or eliminate one or more of the above mentioned disadvantages singly or in any combination. According to an aspect of the invention there is provided a power transmitter for a wireless power transfer system including a power receiver for receiving a power transfer from the power transmitter via a wireless inductive power transfer signal; the power transmitter comprising: a power output circuit comprising a transmit power coil for generating the wireless inductive power transfer signal; a test signal coil for generating a magnetic test signal; a test signal generator coupled to the test signal coil and arranged to feed a test signal to the test signal coil resulting in the generation of the magnetic test signal; a plurality of spatially distributed detection coils; a measurement unit for generating a set of measurement values reflecting signals induced in the spatially distributed detection coils by the magnetic test signal; a processor for determining a measurement spatial distribution of the measurement values, the spatial distribution reflecting positions of the detection coils; and a foreign object detector arranged to detect a presence of a foreign object in response to a comparison of the measurement spatial distribution to a reference spatial distribution, wherein the foreign object detector (219) is arranged to determine the reference spatial distribution in response to data received from the power receiving device (105).

According to another aspect of the invention there is provided a power transmitter for a wireless power transfer system including a power receiver for receiving a power transfer from the power transmitter via a wireless inductive power transfer signal; the power transmitter comprising: a power output circuit comprising a transmit power coil for generating the wireless inductive power transfer signal; a test signal coil for generating a magnetic test signal; a test signal generator coupled to the test signal coil and arranged to feed a test signal to the test signal coil resulting in the generation of the magnetic test signal; a plurality of spatially distributed detection coils; a measurement unit for generating a set of measurement values reflecting signals induced in the spatially distributed detection coils by the magnetic test signal; a processor for determining a measurement spatial distribution of the measurement values, the spatial distribution reflecting positions of the detection coils; and a foreign object detector arranged to detect a presence of a foreign object in response to a comparison of the measurement spatial distribution to a reference spatial distribution, wherein the foreign object detector is arranged to geometrically align the measurement spatial distribution and the reference spatial distribution by performing a geometric transformation of at least one of the measurement spatial distribution and the reference spatial distribution prior to the comparison.

The invention may provide improved foreign object detection in many embodiments and scenarios. In particular, the approach may in many embodiments reduce the risk of false detections and/or reduce the risk of missed detections of a foreign object.

A particular advantage of the approach is that it may in many embodiments and scenarios allow an efficient foreign object detection to be performed even when the power receiving device is present. The approach may in many embodiments allow a differentiation to be made between friendly metal (typically being part of the power receiving device and thus intended to be present) and foreign metal of a foreign object (not part of the power receiving device). This may in many scenarios provide a substantially more effective and reliable foreign object and/or may allow an improved user experience to be provided.

The geometric alignment may substantially increase detection accuracy in many embodiments. It may provide increased flexibility and may in many embodiments allow the power transmitter to adapt to the current scenario and configuration. The approach may in many embodiments provide increased freedom in the placement of power receivers. For example, it may allow a user to position a power receiving device, such as e.g. a kitchen appliance, anywhere within a given area and orientated in any way.

The spatial distribution(s) of measurement values may comprise data indicative of both measured values and a spatial position of the measurements. The position indication may be a relative position indication, e.g. indicating a position relative to other measurement values. The spatial position data may be indicated by a position or arrangement of the measurement values relative to each other. For example, a spatial distribution may be represented by a data structure of measurement values where the location of measurement values in the data structure represents spatial position information for the measurement values. Specifically, the relative order of measurement values in the data structure may correspond to the spatial relationship between the detection coils corresponding to the measurement values.

The detection coils may specifically be arranged in a planar array. The planar array may cover a power transfer surface of the power transmitter arranged to receive the power receiving device.

The test signal coil and the transmit power coil may be the same coil, i.e. the transmit power coil may also be used as the test signal coil.

In accordance with an optional feature of the invention, the reference spatial distribution represents a scenario with no foreign object present.

This may provide improved foreign object detection in many embodiments.

In many embodiments, the reference spatial distribution may represent a scenario where no objects are present.

In accordance with an optional feature of the invention, the reference spatial distribution represents a scenario with a power receiving device present.

This may provide improved foreign object detection in many embodiments. The approach may in particular in many embodiments enable, facilitate, or improve foreign object detection while the power receiving device is present.

In accordance with an optional feature of the invention, the foreign object detector is arranged to store a copy of the measurement spatial distribution, and to use the stored measurement spatial distribution as the reference spatial distribution for future comparisons.

This may facilitate and/or improve foreign object detection. In particular, it may provide an efficient approach for generating a reliable reference spatial distribution suitable for foreign object detection and customized to the specific power transmitter and possibly power receiving device.

The foreign object detector may specifically be arranged to store the measurement spatial distribution in response to a user input indication that no foreign object is present, or e.g. in many embodiments indicating that the power receiving device is present but no foreign object is present.

In accordance with an aspect of the invention, the foreign object detector is arranged to determine the reference spatial distribution in response to data received from the power receiving device.

This may provide a more flexible approach while allowing relatively low complexity of the power transmitter. For example, it may provide foreign object detection specifically customized for the specific power receiving device without requiring the characteristics of this to necessarily be known in advance by the power transmitter, and specifically without requiring a reference spatial distribution to be stored by the power transmitter for the power receiving device.

The foreign object detector is arranged to geometrically align the measurement spatial distribution and the reference spatial distribution by performing a geometric transformation of at least one of the measurement spatial distribution and the reference spatial distribution prior to the comparison.

This may improve foreign object detection in many embodiments and may in particular provide improved adaptation of the detection to the current conditions.

In accordance with an optional feature of the invention, the geometric transformation may include a translation and/or rotation. The foreign object detector may specifically be arranged to align the measurement spatial distribution and the reference spatial distribution such that a match between them is maximized (corresponding to a minimization of a difference measure).

In accordance with an optional feature of the invention, the power transmitter further comprises a user output unit, and wherein the foreign object detector is arranged to generate a user output of an indication of a parameter of the geometric transformation.

This may for example provide an indication to the user allowing the user to move the power receiving device to a more optimal position thereby improving the power transfer operation.

In accordance with an optional feature of the invention, the measurement unit is arranged to generate a plurality of sets of measurement values for different frequencies of the magnetic test signal, the processor is arranged to generate plurality of measurement spatial distributions by generating a measurement spatial distribution for each set of measurement values, and the foreign object detector is arranged to detect the presence of the foreign object in response to comparisons of the plurality of measurement spatial distributions to at least one reference spatial distribution.

This may allow a more accurate foreign object detection in many scenarios.

In some embodiments, the test signal generator is arranged to generate a plurality of test signals with different frequencies resulting in a plurality of magnetic test signals with different frequencies; the measurement unit is arranged to generate a plurality of sets of measurement values, each set of measurement values corresponding to one test signal;

the processing is arranged to generate a plurality of measurement spatial distributions by generating a measurement spatial distribution for each of the sets of measurement values; and the foreign object detector is arranged to detect the response of the foreign object in response to a plurality of comparisons, each comparison being between a measurement spatial distribution of the plurality of measurement spatial distributions and a reference spatial distribution.

In accordance with an optional feature of the invention, at least some of the plurality of spatially distributed detection coils has a maximum dimension not exceeding 20 mm and the plurality of spatially distributed detection coils comprises no less than 20 detection coils.

This may provide particularly advantageous operation in many embodiments, and may specifically provide an advantageous trade-off between complexity and detection performance.

In accordance with an optional feature of the invention, the measurement unit is arranged to generate the set of measurement values by sequentially measuring induced signals of the plurality of spatially distributed detection coils, the sequential measuring comprising separately measuring subsets of the plurality of spatially distributed detection coils.

This may in many applications reduce complexity of the power transmitter.

According to an aspect of the invention there is provided wireless power transfer system comprising a power transmitter and a power receiving device for receiving a power transfer from the power transmitter via a wireless inductive power signal; the power transmitter comprising: a power output circuit comprising a transmit power coil for generating the wireless inductive power transfer signal; a test signal coil for generating a magnetic test signal; a test signal generator coupled to the test signal coil and arranged to feed a test signal to the test signal coil resulting in the generation of the magnetic test signal; a plurality of spatially distributed detection coils; a measurement unit for generating a set of measurement values reflecting signals induced in the spatially distributed detection coils by the magnetic test signal; a processor for determining a measurement spatial distribution of the measurement values, the spatial distribution reflecting positions of the spatially distributed detection coils; and a foreign object detector arranged to detect a presence of a foreign object in response to a comparison of the measurement spatial distribution to a reference spatial distribution, wherein the foreign object detector is arranged to geometrically align the measurement spatial distribution and the reference spatial distribution by performing a geometric transformation of at least one of the measurement spatial distribution and the reference spatial distribution prior to the comparison.

In accordance with an optional feature of the invention, the power receiving device is arranged to transmit the reference spatial distribution to the power transmitter and the power transmitter is arranged to receive the reference spatial distribution from the power receiving device.

According to an aspect of the invention there is provided a method of operation for a wireless power transfer system comprising a power transmitter and a power receiving device for receiving a power transfer from the power transmitter via a wireless inductive power signal; the power transmitter comprising: a power output circuit comprising a transmit power coil for generating the wireless inductive power transfer signal; a test signal coil for generating a magnetic test signal; a plurality of spatially distributed detection coils; and the method comprising the power transmitter performing the steps of: feeding a test signal to the test signal coil resulting in the generation of the magnetic test signal; generating a set of measurement values reflecting signals induced in the spatially distributed detection coils by the magnetic field signal; determining a measurement spatial distribution of the measurement values, the spatial distribution reflecting positions of the detection coils; and detecting a presence of a foreign object in response to a comparison of the measurement spatial distribution to a reference spatial distribution, wherein the comparison comprises geometrically aligning the measurement spatial distribution and the reference spatial distribution by performing a geometric transformation of at least one of the measurement spatial distribution and the reference spatial distribution prior to the comparison.

In accordance with an optional feature of the invention, the method further comprises the steps of the power receiving device transmitting the reference spatial distribution to the power transmitter and the power transmitter receiving the reference spatial distribution from the power receiving device.

According to an aspect of the invention there is provided a method of operation for a power transmitter of a wireless power transfer system also comprising a power receiving device for receiving a power transfer from the power transmitter via a wireless inductive power signal; the power transmitter comprising: a power output circuit comprising a transmit power coil for generating the wireless inductive power transfer signal; a test signal coil for generating a magnetic test signal; a test signal generator coupled to the test signal coil and arranged to feed a test signal to the test signal coil resulting in the generation of the magnetic test signal; a plurality of spatially distributed detection coils; a measurement unit for generating a set of measurement values reflecting signals induced in the spatially distributed detection coils by the magnetic test signal; a processor for determining a measurement spatial distribution of the measurement values, the spatial distribution reflecting positions of the detection coils; and a foreign object detector arranged to detect a presence of a foreign object in response to a comparison of the measurement spatial distribution to a reference spatial distribution, wherein the comparison comprises geometrically aligning the measurement spatial distribution and the reference spatial distribution by performing a geometric transformation of at least one of the measurement spatial distribution and the reference spatial distribution prior to the comparison.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME
EMBODIMENTS OF THE INVENTION

The following description focuses on embodiments of the invention applicable to a wireless power transfer system utilizing a power transfer approach such as known from the Qi specification. However, it will be appreciated that the invention is not limited to this application but may be applied to many other wireless power transfer systems.

Figure 1:
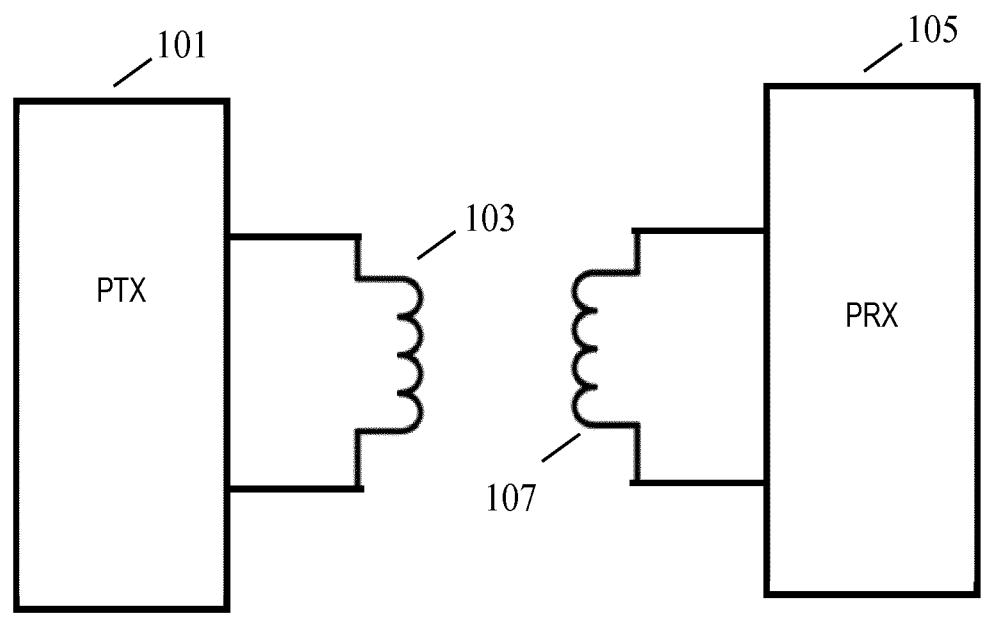
FIG. 1 illustrates an example of elements of a power transfer system in accordance with some embodiments of the invention.

FIG. 1 illustrates an example of a power transfer system in accordance with some embodiments of the invention. The power transfer system comprises a power transmitter 101 which includes (or is coupled to) a transmitter coil/inductor 103. The system further comprises a power receiving device 105 which includes (or is coupled to) a receiver coil/inductor 107.

The system provides a wireless inductive power transfer from the power transmitter 101 to the power receiving device 105. Specifically, the power transmitter 101 generates a wireless inductive power transfer signal (also referred to as a power transfer signal, power transfer signal or an inductive power transfer signal), which is propagated as a magnetic flux by the transmitter coil or inductor 103. The power transfer signal may typically have a frequency between around 20 kHz to around 500 kHz, and often for Qi compatible systems typically in the range from 95 kHz to 205 kHz (or e.g. for high power kitchen applications, the frequency may e.g. typically be in the range between 20 kHz to 80 kHz). The transmitter coil 103 and the power receiving coil 107 are loosely coupled and thus the power receiving coil 107 picks up (at least part of) the power transfer signal from the power transmitter 101. Thus, the power is transferred from the power transmitter 101 to the power receiving device 105 via a wireless inductive coupling from the transmitter coil 103 to the power receiving coil 107. The term power transfer signal is mainly used to refer to the inductive signal/magnetic field between the transmitter coil 103 and the power receiving coil 107 (the magnetic flux signal), but it will be appreciated that by equivalence it may also be considered and used as a reference to an electrical signal provided to the transmitter coil 103 or picked up by the power receiving coil 107.

In the example, the power receiving device 105 is specifically a power receiver which receives power via a receive coil 107. However, in other embodiments, the power receiving device 105 may comprise a metallic element, such as a metallic heating element, in which case the power transfer signal induces eddy currents resulting in a direct heating of the element.

The system is arranged to transfer substantial power levels, and specifically the power transmitter may support power levels in excess of 500 mW, 1 W, 5 W, or 50 W in many embodiments. For example, for Qi corresponding applications, the power transfers may typically be in the 1-5 W power range for low power applications, and in excess of 100 W and up to more than 1000 W for high power applications, such as e.g. kitchen applications.

In the following, the operation of the power transmitter 101 and the power receiving device 105 will be described with specific reference to an embodiment in accordance with the Qi Specification (except for the herein described (or consequential) modifications and enhancements) or suitable for the higher power kitchen specification being developed by the Wireless Power Consortium. In particular, the power transmitter 101 and the power receiving device 105 may substantially be compatible with the Qi Specification version 1.0, 1.1 or 1.2 (except for the herein described (or consequential) modifications and enhancements).

In wireless power transfer systems, the presence of a foreign object (typically a conductive element extracting power from the power transfer signal and not being part of the power receiving device 105, i.e. being an unintended, undesired, and/or interfering element to the power transfer) may be highly disadvantageous during a power transfer. Such an undesired object is in the field known as a foreign object.

A foreign object may not only reduce efficiency by adding a power loss to the operation but may also degrade the power transfer operation itself (e.g. by interfering with the power transfer efficiency or extracting power not directly controlled e.g. by the power transfer loop). In addition, the induction of currents in the foreign object (specifically eddy currents in the metal part of a foreign object) may result in an often highly undesirable heating of the foreign object.

In order to address such scenarios, wireless power transfer systems such as Qi include functionality for foreign object detection. Specifically, the power transmitter comprises functionality seeking to detect whether a foreign object is present. If so, the power transmitter may e.g. terminate the power transfer or reduce the maximum amount of power that can be transferred.

Current approaches proposed by the Qi Specifications are based on detecting a power loss (by comparing the transmitted and the reported received power) or detecting degradations in the quality Q of the output resonance circuit. However, these approaches have been found to provide suboptimal performance in many scenarios, and they may specifically lead to inaccurate detection resulting in missed detections and/or false positives where a foreign object is detected despite no such object being present.

The system of FIG. 1 uses a different approach for foreign object detection. The approach is based on using a plurality of spatially distributed detection coils and generating a spatial distribution of measurements of signals induced in these detection coils by a magnetic test signal generated by a test signal being fed to a test signal coil. The spatial distribution may in many embodiments be perceived as a magnetic image and may reflect the objects in the neighborhood that affect the magnetic field generated by the test signal coil.

As an example, the approach may perform foreign object detection based on using a separate test signal coil to generate a magnetic test signal and thus a magnetic test field, with an array of small detection coils measuring the influence of metal objects on the field generated by the test signal coil. The detection coils may typically be arranged in a matrix arrangement. The measurements may specifically be suitably timed signal level measurements for each of the detection coils. The spatial distribution of such measurements can be considered to correspond to a magnetic image with each detection coil representing a pixel of the image. Thus, the spatial distribution may be a two dimensional arrangement of the measurement values, and specifically may be a two dimensional array or matrix of measurement values from the different detection coils. Specifically, the spatial distribution of the measurement values will reflect the positions of the detection coils. In this way, the spatial distribution reflects the position at which the individual measurements have been generated and thus represents the spatial distribution or variation of the magnetic test field (such as specifically the strength of the magnetic field resulting (directly or indirectly) from the test signal being fed to the test signal coil).

Thus, the exemplary approach can be viewed as the power transmitter including coils that implement a magnetic camera generating a magnetic image by each detection coil corresponding to a pixel.

In the example, the test signal coil 209 and the transmitter power coil 103 are illustrated and described as separate and independent coils. This may allow individual optimization of the individual coils for the specific purpose. However, in other embodiments, the test signal coil 209 and the transmitter power coil 103 may be the same coil, i.e. the same coil may be used to generate the power transfer signal and to generate the magnetic test signal. For example, the two signals may be separated in the time domain using a time division approach or may alternatively be separated e.g. in the frequency domain by the signals having different frequencies. This may allow a lower cost implementation in some scenarios.

The spatial distribution is compared to a reference spatial distribution which reflects a scenario when no foreign object is present, but possible with a power receiving device 105 being present, i.e. it is compared to a reference magnetic image corresponding to a situation with no foreign object being present. If the generated magnetic image is sufficiently similar to the reference magnetic image, the foreign object detector may decide that no foreign object is present and otherwise it may decide that the difference may be due to a foreign object potentially being present.

For example, the power transmitter can detect the presence of a metal object on its surface by taking a magnetic picture and comparing it to the situation in which no object is present. If at least one pixel shows a sufficiently large difference, a metal object may be determined to be detected.

Figure 2:
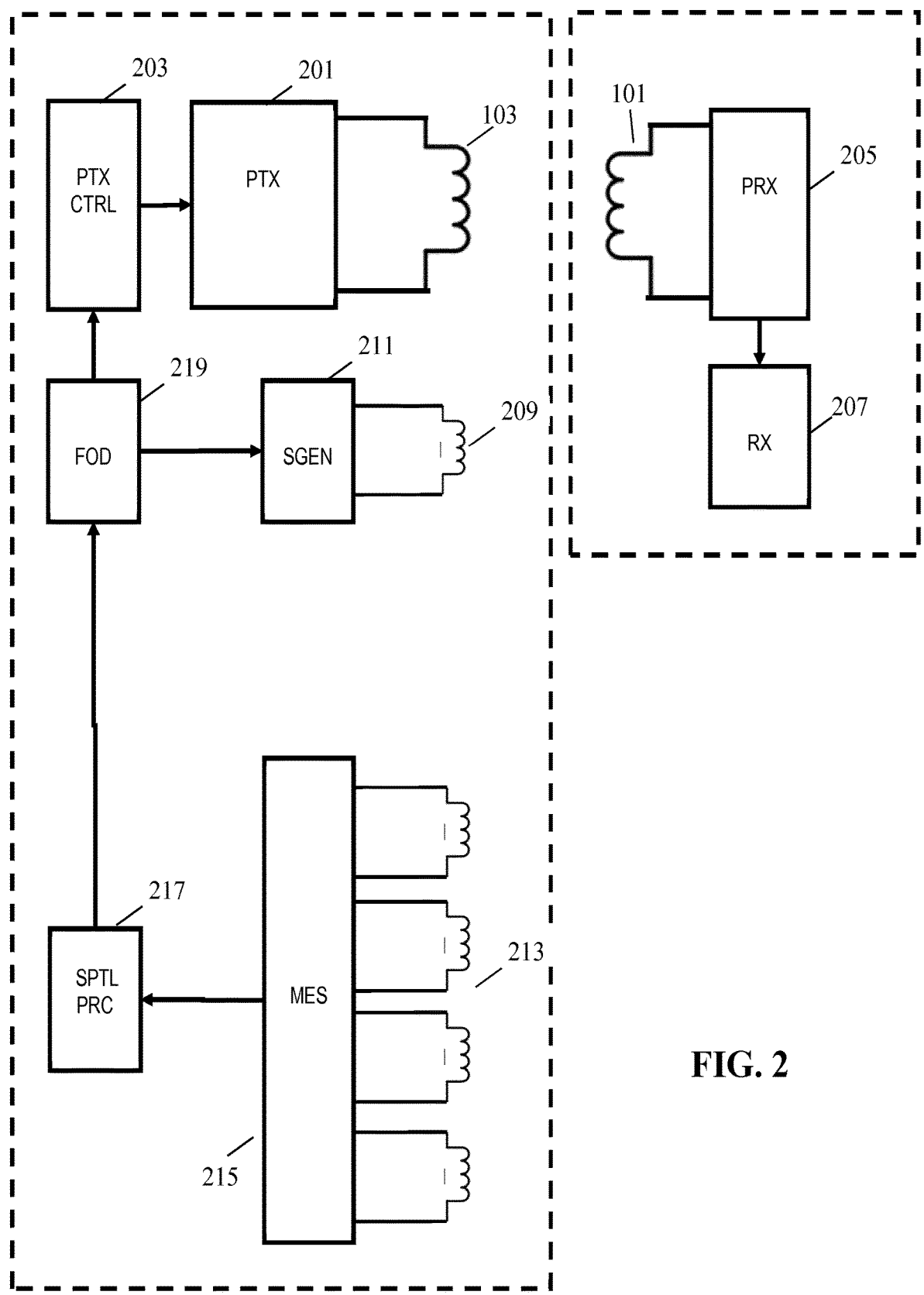
FIG. 2 illustrates an example of elements of a power transfer system in accordance with some embodiments of the invention.

FIG. 2 illustrates an example of elements of the system of FIG. 1 in more detail.

The power transmitter 101 comprises a power output circuit including a driver 201 and the transmitter coil 103. The driver 201 generates a power drive signal which is fed to the transmitter coil 103 resulting in this generating a magnetic/inductive power transfer signal. The driver 201 is arranged to generate a drive signal of sufficient power for the specific power transfer operation. In some embodiments, the power range may be in the order of a few tens of watts but in other embodiments it may be substantially higher, and indeed may be more than a 1 kW.

The driver 201 may for example comprise an output stage in the form of a full or half bridge switch arrangement as will be known to the skilled person. It will also be appreciated that whereas FIG. 2 illustrates the driver 201 directly driving the transmitter coil 103, the transmitter coil 103 will typically be part of a resonance circuit further comprising a resonance capacitor in series or parallel with the transmitter coil 103.

The driver 201 is coupled to a power transmitter controller 203 which is arranged to control the operation of the power transmitter 101 and specifically to control the driver 201 to provide a suitable drive signal (e.g. with the required power level). In addition, the power transmitter controller 203 is arranged to control the power transmitter 101 to perform the necessary and desired functions for the power transmitter 101 to operate in accordance with the appropriate specification or standards. In the specific example, the power transmitter controller 203 may control the power transmitter 101 to operate in accordance with the Qi specifications (except for changes described herein).

The power transmitter 101 can thus support wireless power transfers by generating a power transfer signal from which a power receiving device can extract power. In the example of FIG. 2, the power receiving device 105 is shown comprising a power receiving coil 107 coupled to a power receiver circuit 205. The power receiving circuit 205 is arranged to receive the induced signal from the power receiving coil 107 and to extract power that can be fed to an external or internal load. The power receiving circuit 205 may for example include a rectifier circuit, a voltage stabilization circuit etc. as is known in the art.

The power receiving circuit 205 is further coupled to a power receiver controller 207 which is arranged to control the operation of the power receiver 105 to perform the necessary and desired functions for the power receiver 105 to operate in accordance with the appropriate specification or standards. In the specific example, the power receiver controller 207 may control the power receiver 105 to operate in accordance with the Qi specifications (except for changes described herein). Such operation may include establishing and maintaining suitable communication with the power transmitter 101, e.g. to support the establishment of a power control loop etc.

It will be appreciated that whereas FIGS. 1 and 2, illustrate the power extraction by a power receiving coil 107 coupled to a power receiving circuit 205, the power may in other embodiments be extracted by other means. For example, in some embodiments, the power receiving device 105 may comprise a metallic heating element to which power is directly coupled by the induction of eddy currents. In such examples, the power receiver controller 207 may for example use a power control loop to control the transmitted power level to result in a desired temperature.

The power transmitter 101 furthermore comprises functionality for foreign object detection. The power transmitter 101 thus comprises functionality for detecting if an object other than the power receiving device 105 is present in the power transfer zone. Thus, the foreign object detection may seek to detect a foreign object being an object other than the power receiving device 105 extracting power from the power transfer signal.

The foreign object detection is based on the generation of a magnetic test signal and accordingly the power transmitter 101 comprises a test signal coil 209 which is coupled to a test signal generator 211. The test signal generator 211 generates an electric test signal which is fed to the test signal coil 209 resulting in the magnetic test signal being generated, i.e. the test signal generator 211 generates a magnetic test field. In different embodiments, the test signal from the test signal generator 211 may e.g. be a short time interval of a periodic signal (e.g. a sinewave, a square wave, a triangular wave signal etc.), a continuous periodic signal, or may e.g. be a short pulse). A corresponding time varying magnetic test signal is thus generated.

The power transmitter 101 furthermore includes a plurality of detection coils 213 which are arranged to detect the magnetic test signal by this causing a voltage to be induced in the detection coils 213. The detection coils are spatially distributed, and specifically may be spatially distributed in a planar area. Thus, the detection coils 213 may be distributed over an area which specifically may be, or include, a power transfer area of the power transmitter 101 for receiving the power receiving device 105.

The detection coils 213 are positioned relative to the test signal coil 209 such that the generated magnetic test signal will induce a voltage (and consequent current) in the detection coils 213, at least in the case where no foreign object is present.

The detection coils 213 are coupled to a measurement unit 215 which is arranged to perform measurements to generate a set of measurement values reflecting signals induced in the spatially distributed detection coils by the magnetic test signal. The measurement unit 215 may specifically measure the current or voltage of each of the detection coils 213 to generate a measurement reflecting the level of the magnetic test signal at the position of the corresponding detection coil 213.

As a specific example, each of the detection coils 213 may be terminated by a high Ohmic resistor in the measurement unit 215, and the measurement unit 215 may include an A/D converter which samples the voltage across the resistor. The samples may be used to generate a measurement reflecting e.g. the signal strength of the magnetic test signal. In some embodiments, the measurement may e.g. include an averaging, e.g. over at least one time period for the magnetic test signal. In other embodiments, the measurement may e.g. be a sample performed at an appropriate time. For example, the sampling of the signal of the detection coils 213 may be with a suitable phase offset relative to the test signal fed to the test signal coil 209.

Thus, the measurement unit 215 generates a set of measurement values which reflects the magnetic flux density of the magnetic test signal at the different positions represented by the individual detection coils 213. The detection coils 213 may specifically be arranged in a planar array (or specifically matrix) arrangement and the set of measurement values may accordingly effectively be seen as a magnetic image where each pixel corresponds to one of the detection coils 213.

The measurement unit 215 is coupled to a processor, henceforth referred to as the spatial processor 217, which is fed the set of measurements and which is arranged to determine a measurement spatial distribution of the measurement values where the spatial distribution reflects the positions of the detection coils 213.

The spatial distribution may for example be generated by arranging the measurements in a data structure in accordance with the physical spatial arrangement of the detection coils 213. For example, a data structure may be used where measurements from adjacent detection coils 213 are located next to each other. Specifically, the measurement unit 215 may generate the spatial distribution as a matrix of the generated measurement values such that these are arranged to match the matrix arrangement of the detection coils 213. Thus, specifically, the spatial processor 217 may receive the measurement values from the measurement unit 215, e.g. in the order in which they are made, and may in response generate a spatial distribution reflecting both the measurement results and the positions corresponding to the measurements.

Thus, whereas the set of measurement values may comprise only the measurement values with no spatial information, the spatial distribution of the measurement values reflects both the measurement values and the positions of the detection coils 213. The spatial distribution thus reflects both the measurements and where these were made.

The specific approach used for the spatial distribution to reflect both measurement values and the spatial relationship between these may depend on the individual preferences and requirements of the individual embodiment. For example, in some embodiments, the spatial distribution may be represented by a data structure with the contained values corresponding to the measurement values and the arrangement of these in the structure reflecting the spatial arrangement. Specifically, the measurement values may be stored in a matrix structure corresponding to the matrix positioning of the detection coils 213. In other embodiments, the spatial distribution may e.g. be represented by two component values in a random order with a first component reflecting the measurement value and the second component reflecting the position of the corresponding detection coil 213.

It will be appreciated that although FIG. 2 illustrates different entities performing the measurements and generating the spatial distribution, these may in some embodiments be generated as a combined operation. E.g. the measurement values may directly be stored at the appropriate positions in a suitable data structure, such as directly in a matrix data structure.

The spatial processor 217 is coupled to a foreign object detector 219 arranged to detect a presence of a foreign object in response to the measurement spatial distribution generated by the spatial processor 217. Specifically, the foreign object detector 219 is arranged to compare the measurement spatial distribution to a reference spatial distribution and to generate a detection in response to this comparison.

E.g. if the comparison results in a similarity criterion being met, then the foreign object detector 219 may generate an indication that a foreign object is not detected. However, if the similarity criterion is not met, and thus the current magnetic image differs sufficiently from the reference magnetic image, then the foreign object detector 219 generates an indication that a foreign object has indeed been detected.

The foreign object detection result is fed to the power transmitter controller 203 which may control the operation of the power transmitter 101 in accordance with the detection result. For example, the detection may be performed as part of the initialization of a power transfer operation and if the detection indicates that no foreign object is present, the system may proceed to initialize the power transfer. However, if a foreign object is detected then the power transmitter controller 203 may proceed to instantly terminate the initialization such that no power transfer is initiated.

Thus, the approach may for example prevent initialization of a power transfer in scenarios where there may be a foreign object present. This may e.g. increase safety precautions and e.g. ensure that a power transfer is not initiated which could result in undesirable heating of e.g. a coin or set of keys left in the power transfer area.

The exact physical arrangement of the individual detection coils 213, as wells of the test signal coil 209 and the transmitter coil 103, will depend on the preferences and requirements of the individual embodiment. Similarly, the physical dimensions and properties of the individual coils will depend on the preferences and requirements of the individual embodiment.

Figure 3:
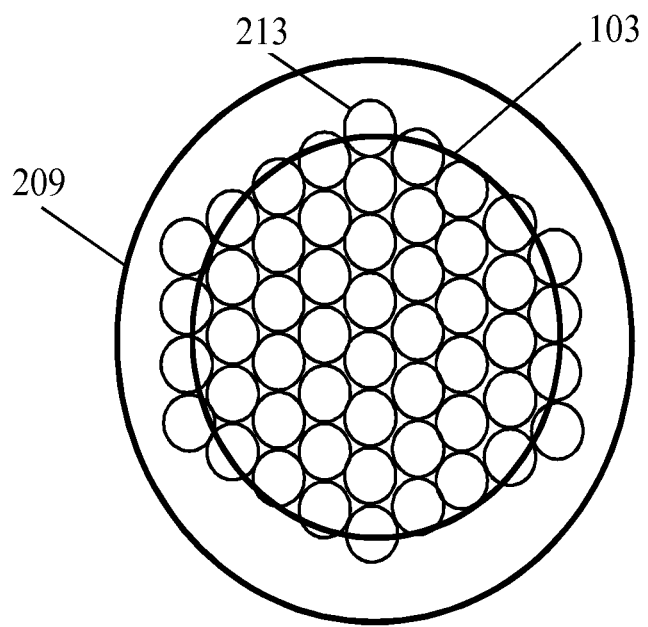
FIG. 3 illustrates an example of an arrangement of coils in a power transmitter in accordance with some embodiments of the invention.

However, in many embodiments, the detection coils 213 may be arranged in a planar array (or matrix) arrangement. Specifically, the detection coils 213 may be arranged in an equidistant grid with detection coils 213 being positioned at nodes of the grid within a given detection area (in some embodiments only a subset of the nodes may correspond to the position of a detection coil 213). An example of such an arrangement is illustrated in FIG. 3. As can be seen, the detection coils 213 form an area which is covered by the detection coils 213. The detection coils 213 form a grid or matrix and thus the corresponding measurements can be considered to generate a magnetic image reflecting the spatial variations of the magnetic field corresponding to the magnetic test signal.

In the example, the transmitter power coil 103 is relatively large and defines a relatively large power transfer area. A power receiving device 105 positioned in the relatively large power transfer area will thus be exposed to a potentially powerful power transfer magnetic field allowing the power receiving device 105 to extract substantial power.

The detection coils 213 cover the power transfer area and thus can be used to generate an effective magnetic image of the power transfer area thereby generating a magnetic image reflecting any objects present in the power transfer area.

In order to get a reasonable spatial resolution allowing an efficient foreign object detection, it is often advantageous to have a relatively high number of detection coils 213. In order, to achieve this, the detection coils 213 may often be selected to be relatively small, especially in comparison to the transmitter power coil 203. This may also allow smaller objects to be detected as it provides a higher spatial resolution.

In many embodiments, the number of detection coils 213 is typically no less than 20 detection coils. This may in many embodiments provide a resolution suitable for reliable object detection of sufficiently small objects. For many practical implementations, the detection coils 213 have a maximum dimension (typically a diameter of a circular coil or a diagonal length of a square coil) not exceeding 20 mm (and often in the range of 10-15 mm). Such approaches have been found to provide particularly efficient foreign object detection in many practical implementations, such as e.g. for systems compatible with the Qi specifications. Further, keeping the dimensions of the detection coils 213 sufficiently small allows for relatively small foreign objects, such as e.g. coins, to be detected.

In many embodiments, however, the number of detection coils 213 does not exceed 500, 200 or 100 coils. Thus, in many embodiments, the number of measurements (and thus the number of pixels in the magnetic image) is kept relatively low. This reduces cost and complexity as well as facilitates the processing of the foreign object detection. However, it has been found to still allow very reliable foreign object detection in many embodiments.

In the specific example of FIG. 3, a total of 52 detection coils have been used. FIG. 3 represents a top view of the power transmitter power transfer area. The array of 52 detection coils 213 cover the power transfer area wherein the transmitter coil 103 can provide a high magnetic field strength.

FIG. 3 also illustrates the test signal coil 209. In the specific example, the test signal coil 209 is positioned around the array of detection coils 213, i.e. such that it encompasses the detection coils 213. The size of the test signal coil 209 is thus in this example larger than the combined size of the detection coils 213 and further is positioned such that it surrounds the detection coils 213. This may provide an efficient magnetic test signal in many embodiments.

Figure 4:
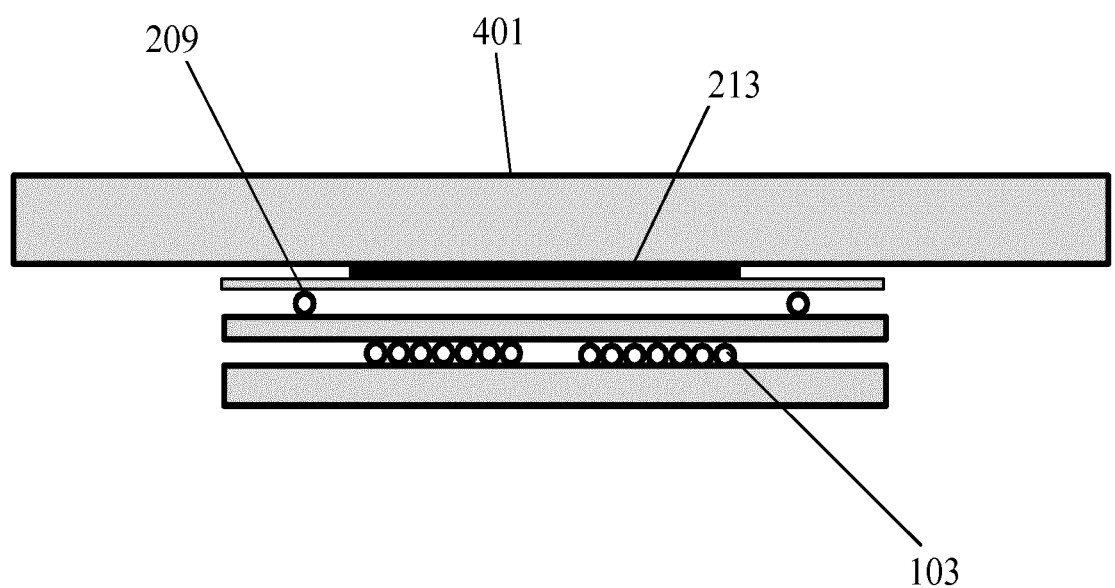
FIG. 4 illustrates an example of a cross section of a coil arrangement of a power transmitter in accordance with some embodiments of the invention.

FIG. 4 illustrates a cross-section of the power transmitter and specifically of the arrangements of respectively the detection coils 213, the test signal coil 209, and the transmitter coil 103. Again, the specific arrangement may differ between embodiments but in many scenarios the detection coils 213 may be positioned relatively close to the surface 401 for receiving the power receiving device 105. This may in many embodiments result in an improved magnetic image being generated.

When measurements are being performed in order to generate the set of measurement values, the test signal generator 211 first generates a test signal and feeds this to the transmitter coil 103. The exact characteristics of the test signal, and thus the resulting magnetic test signal, will depend on the characteristics of the individual embodiment. However, the test signal generator 211 will generate the test signal as a time varying signal resulting in a time varying magnetic test signal which accordingly will induce (directly or indirectly) a voltage in the detection coils 213.

In some embodiments, the test signal may simply be generated as a sine wave signal or a square wave signal (e.g. for a certain test duration) which will result in a correspondingly varying magnetic field (and specifically a varying flux density B). If no magnetic or electrically conductive elements are present, this varying magnetic field will induce a corresponding voltage in the detection coils 213.

The measurement unit 215 may measure the resulting induced signal levels, e.g. by rectifying the current and measuring the resulting average value. This will result in a set of measurement values that will typically reflect a fairly smooth and homogenous spatial distribution. In other words, a homogenous magnetic image will result.

However, if an electromagnetic element is present, this will affect the resulting magnetic field leading to variations in the magnetic field. The changes will have a spatial variation and effectively the presence of the electromagnetic element will result in changes in the measurement values for the different detection coils 213. The electromagnetic element will effectively result in the electromagnetic image no longer varying homogenously but rather exhibiting spatial variations that reflect the presence of the electromagnetic element. Indeed, in many embodiments, the electromagnetic element may effectively leave an imprint on the magnetic image.

For example, if a ferromagnetic or ferrimagnetic element is positioned on the power transfer surface, and thus across one or more of the detection coils 213, the magnetic test signal will correspond to a magnetic field that will cause the magnetic domains of the magnetic element being aligned with the original field causing a magnetization of the element resulting in an increased magnetic flux density compared to when no magnetic element is there. Thus, the magnetic flux density through the detection coils 213 will be different than when no element is present, and specifically a higher voltage (or emf) will be induced in detection coils 213 proximal to the element.

A similar result may occur if a conductive, and specifically a metallic, object is positioned on the power transfer surface although the effect may be caused by a slightly different mechanism. Specifically, the changes in the magnetic test signal will result a varying magnetic flux density causing eddy currents to be induced in the metallic object. However, these eddy currents will then result in a magnetic field (i.e. they will result in magnetic flux density that will combine with the one resulting from the magnetic test signal) resulting in typically a changed magnetic field/flux density around the object. This will also tend to result in a different level of the induced voltage which will be reflected by the measurements of the proximal detection coils 213. Specifically, in the scenario, the (Eddy) currents induced in the metallic object can cause an inverse field resulting in a decreased magnetic field near the object. Such areas of reduced field strength can then be detected.

Figure 5:
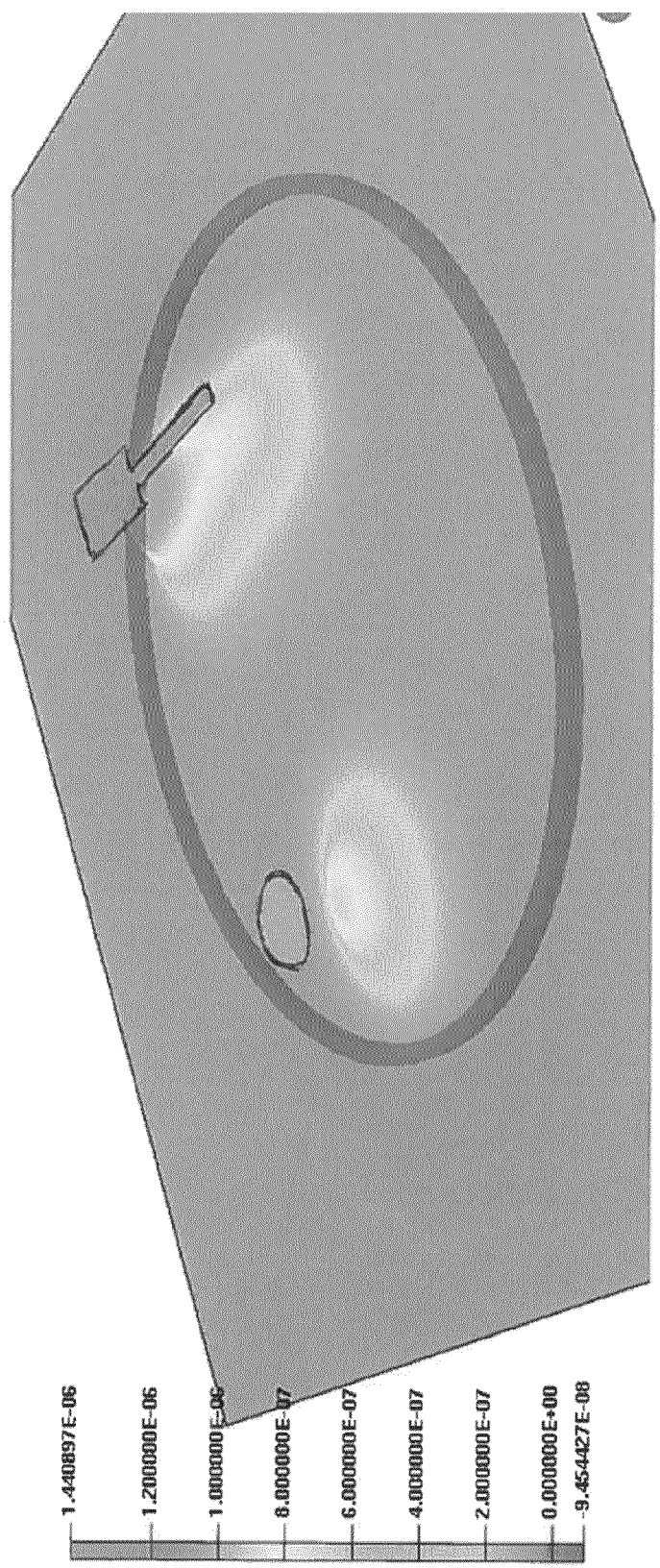
FIG. 5 illustrates an example of a magnetic field of the power transfer system of FIG. 2 in the presence of two metallic objects.

An example of a magnetic field in the presence of two metallic objects is illustrated in FIG. 5.

The measurement values may in many embodiments be generated to be indicative of a level of the voltage induced in the corresponding detection coils 213 by the magnetic test signal (directly or indirectly, i.e. including the induction due to the magnetic flux density variations caused by eddy currents induced by the magnetic test signal). In some embodiments, the measurement values may be generated e.g. as low pass filtered (averaged) level values. For example, each of the detection coils 213 may be connected to a rectifier circuit followed by a low pass filter and the output of the low pass filters may be measured, e.g. after as suitable delay following the start of the generation of the test signal. As another example, the measurement may in some embodiments include a peak detector and the measurement value may be a peak value of the induced voltage during a time when the magnetic test signal is generated.

As yet another example, the measurement values may be generated by measuring the value of the induced voltage at a specific point in time, and specifically a sampling of the voltage of the detection coils 213 may be used. In such examples, the timing of the measurements/sampling may be carefully controlled, e.g. by setting a phase offset or time offset between the test signal and a sample time control signal. Such an approach may reflect that the magnetic mechanisms resulting in the changed behavior results in phase changes from the original signal (e.g. induction of voltages is dependent on the derivative of the magnetic flux density thus introducing a phase shift for sine wave signal components). Indeed, in some embodiments, the measurement values may reflect a phase difference between the test signal/magnetic test signal and the induced signals. Due to the mechanisms described above, this phase is different for no foreign object being present and for e.g. a metallic object being present (as the process of inducing eddy currents resulting in additional magnetic flux contributions also introduces additional phase shifts).

Thus, the measurement values will tend to be dependent on whether a conductive object, such as e.g. a key or a set of keys, is present or not. Further, as the effect tends to be localized, the spatial evaluation by the system can provide additional information that can be used in the foreign object. Thus, rather than merely considering the size of a potential power loss or a quality (Q) degradation, the system also considers the spatial information which allows a much more accurate detection.

Indeed, the comparison to determine whether a foreign object is considered to be present or not is based on considering the spatial distribution of the measurement values, i.e. the detection considers not only the measurement values but also the associated positions of these values.

The foreign object is determined based on a comparison of the spatial distribution of measurement values, referred to as the measurement spatial distribution, to a reference spatial distribution. The foreign object detector 219 thus compares the actual measurement results to a reference and may e.g. generate a detection of a foreign object if these differ too much, i.e. if the measurement spatial distribution and the reference spatial distribution fail to meet a given similarity criterion.

The foreign object detection may specifically be based on comparing the measurement spatial distribution to a reference spatial distribution which reflects a scenario in which no foreign object is present, and indeed in some situations may reflect a scenario in which no power receiving device 105 is present either.

For example, the reference spatial distribution may be generated to consist of reference measurement values which may correspond to values that may be measured with no objects present. These values will depend on the specific characteristics of the generated test signal as well as on characteristics of the test signal coil 209 and the detection coils 213, including the geometric relationships between these. In some embodiments, such a reference spatial distribution, or image, can indeed be generated by analytical evaluation of the physical properties of the power transmitter 101.

In such a case, the reference spatial distribution will tend to have relatively smooth and small variations. Indeed, in many situations, the reference spatial distribution may correspond almost to a spatially constant distribution, i.e. the measurement values may be substantially the same for all detection coils 213. In other embodiments, the magnetic flux density of the magnetic test signal may vary somewhat over the area spanned by the detection coils 213 due to the characteristics of the test signal coil 209 and detection coils 213 arrangements (e.g. in the example of FIG. 3, it may be slightly lower for detection coils 213 in the center of the test signal coil 209 than for detection coils 213 towards the periphery of the test signal coil 209). Thus, in such scenarios, the reference spatial distribution may contain reference measurement values which are e.g. slightly lower in the center of the test signal coil 209 and then gently decreasing towards the test signal coil 209.

In such a case, the foreign object detector 219 may e.g. perform a comparison by determining the difference between the actual measurement value for each detection coil 213 and the corresponding reference measurement value (e.g. after a scaling to compensate for different average values in the distributions). If no foreign objects are currently present, this should result in a smooth spatial variation of differences which are furthermore likely to be small, and ideally zero. However, if a subset, or specifically one, of the measurement values results in a high difference measure, this may indicate that a foreign object is indeed present. The spatial distribution may further be considered. For example, the difference values may be determined and all detection coils 213 for which the difference exceeds a threshold may be identified. It may then be evaluated whether these are part of one or more areas that are sufficiently small to be likely to correspond to a(n undetected) foreign object. If so, the foreign object detector 219 may determine that a foreign object is present and may generate a detection result indicative of a foreign object being present.

In some embodiments, the reference spatial distribution may reflect a scenario wherein a power receiving device 105 is present. Specifically, the reference spatial distribution may reflect a situation wherein a power receiving device 105 is present on the power transfer surface. The reference spatial distribution may for example include a pattern of measurements reflecting the magnetic shape or imprint of the power receiving device 105.

For example, the power receiving device 105 may be a device which comprises some metallic elements and accordingly the magnetic test signal will result in measurement values which are higher for detection coils 213 close to these metallic elements. Accordingly, the power receiving device 105 may result in a certain pattern of measurement values with above average value. In some embodiments, the reference spatial distribution may reflect the magnetic pattern of the power receiving device 105 and thus when comparing the measurement spatial distribution to the reference spatial distribution, this comparison may include a consideration or expectation that a pattern of measurements with higher values will be present.

As a specific example, the reference spatial distribution may comprise reference measurement values which would be (expected to be) measured by the detection coils 213 when a power receiving device 105 is present. If the measurement spatial distribution is subsequently generated when the power receiving device 105 is actually present, the comparison to the reference spatial distribution will compensate for this and a false detection of a foreign object due to the presence of the power receiving device 105 can be avoided. Specifically, if difference values are generated, these will also be low for the detection coils 213 for which increased values are measured due to the power receiving device 105 being present.

The comparison of the measurement spatial distribution and reference spatial distribution may include an alignment of the measurement spatial distribution and the reference spatial distribution, i.e. the measurement and reference magnetic images may be aligned before (or as part of) being compared to each other.

For example, the two spatial distributions may be shifted with respect to each other prior to the difference values being generated. This approach may be repeated for a number of different offsets, including for different directions and values. The alignment which results in the lowest overall difference between the measurement spatial distribution and the reference spatial distribution may then be selected, and the foreign object detection may be based on the difference values for this alignment.

As another example, the two spatial distributions may be rotated with respect to each other prior to the difference values being generated. This approach may be repeated for a number of different rotations and the rotation alignment that results in the lowest overall difference between the measurement spatial distribution and the reference spatial distribution may then be selected, and the foreign object detection may be based on the difference values for this alignment.

In many embodiments, both rotations and shifts may be considered. For example, for each offset or shift, a number of difference values may be determined for different rotations. The lowest difference value may be identified and used as the difference value for that offset. This may be repeated for a number of different offsets, and subsequently the offset resulting in the lowest difference value may be selected and used for the foreign object detection.

In some embodiments, additional or alternative geometric transformations may be considered. For example, in some embodiments, a mirroring of one of the spatial distributions may be applied (often together with rotations and translations). This may for example be appropriate in embodiments wherein a power receiver may have an asymmetric shape and may e.g. also be positioned upside down on the power transmitter. In such examples, the power receiver may have mirror electromagnetic footprints depending on which way up the device is positioned.

In many embodiments, the foreign object detector 219 may be arranged to apply a geometric transformation to either the measurement spatial distribution or the reference spatial distribution (or both) before (or while) comparing these to each other. For simplicity and brevity, the following example will focus on the geometric transformation being applied to the measurement spatial distribution.

The geomtric transformation may be expressed as a mathematical function which transforms coordinates of the measurement spatial distribution into new coordinates with the comparison being based on these new coordinates. The geometric transformation may be dependent on a number of parameters.

For example, the measurement spatial distribution may comprise measurements for the spatially distributed detection coils where each measurement is associated with a two dimensional coordinate. Similarly, each value of the reference spatial distribution is associated with a two dimensional coordinate. The comparison may involve dividing the values of the measurement spatial distribution and the reference spatial distribution into pairs and determining the difference between the values for each pair. The detection may then be performed based on these difference values. For example, an overall difference value may be calculated as e.g. the sum or average of the pair difference values.

The pairing may often be based on a requirement that the geomtric distance between the coordinates of the values being paired is minimized. However, rather than determining the distance between coordinates of the original measurement spatial distribution and reference spatial distribution, the coordinates of (e.g. the measurement spatial distribution) may be subjected to a geometric transformation before (or as part of) the distance assessment. The geometric transformation may then be determined to minimize the overall difference value.

The geometric transformation may for example be a function performing a shift by a value a followed by a rotation by a given angle $\varphi$ (e.g. using the well-known sine and cosine rotation functions). The values $\alpha$, $\varphi$ may then be determined to result in a minimised difference value (e.g. determined by pairing values dependent on the transformed parameters where the transformation is given by $\alpha$ and $\varphi$) and this may be used to perform the object detection.

It will be appreciated that whereas the determination of the parameters of the geometric transformation may e.g. be performed as a post-processing applied to the measurement spatial distribution in order to minimize the difference value, many other options are possible. For example, in some embodiments, a control loop may be implemented which controls the values of the geometric transformation parameter, e.g. using the calculated difference value as an error signal.

In some embodiments, the reference spatial distribution may be a partial spatial distribution reflecting only a subset of the area covered by the detection coils 213. For example, the reference spatial distribution may only comprise a representation corresponding to the power receiving device 105, and may thus specifically reflect the magnetic pattern of the power receiving device 105. The foreign object detector 219 may align this pattern with the measurement spatial distribution by identifying a relative position of the pattern resulting in the best match between the pattern and the measurement spatial distribution. The pattern may then be subtracted from the corresponding measurement values to generate a compensated spatial distribution in which the effect of a power receiving device 105 being present has been compensated. The resulting compensated spatial distribution may then be evaluated to detect if any further areas of different measurement values can be found. Alternatively, the foreign object detector 219 may in some embodiments simply ignore the measurement values that are considered to be within the area covered by the power receiving device 105 (as indicated by the pattern matching).

A particular advantageous aspect of the described approach is that the foreign object detection is not merely based on a general or combined evaluation of whether any objects are present or not but rather allows for a more sophisticated approach to be used which specifically may allow a differentiation between the presence of a power receiving device 105 and the (additional or alternative) presence of the foreign object. Thus, the approach may enable the differentiation between e.g. metal of the power receiving device 105 and a foreign metal object. Furthermore, the approach may allow this differentiation to have high reliability thereby providing a reliable foreign object detection.

For example, the reference spatial distribution may be generated to represent a magnetic image of the power transfer surface in the presence of a power receiving device 105. The reference spatial distribution may accordingly include a "profile"/"signature"/"fingerprint" of the power receiving device 105. Accordingly, the power transmitter 101 can compare this scenario to the current situation and estimate whether a foreign object is present or not. For example, it may consider that if at least one of the pixels differs sufficiently, then a foreign metal object is detected.

As an example, a cordless kitchen system based on inductive wireless powering of appliances, may run the risk of unintentionally heating foreign metal objects that are inadvertently placed in the generated magnetic field for transferring power. Therefore, it is desirable for the system to detect the presence of such objects and e.g. to shut down the power transfer in response. A complication is that the appliance that is to receive power may include metal that is e.g. intentionally used in the appliance for heating purposes ("friendly metal"). It is therefore desirable to be able to distinguish between foreign and friendly metals. The described approach allows the foreign object detector 219 to reliably make such a differentiation.

It will be appreciated that different approaches for generating the reference spatial distribution may be used in different embodiments. For example, in some embodiments, the measurement values for different detection coils 213 may be estimated by theoretical calculations or simulations.

However, in many embodiments, the foreign object detector 219 may be arranged to store a copy of a measurement spatial distribution and use this as a reference spatial distribution for future comparisons. The measurement spatial distribution that is stored may specifically be one which is made when no foreign object is present, and specifically in many embodiments where no foreign object is present but the power receiving device 105 is present.

For example, a user may provide a manual input to the power transmitter 101 after positioning the power receiving device 105 on the power transfer surface and after ensuring that no foreign object is present. In response to this activation, the power transmitter 101 may proceed to generate a measurement spatial distribution using the same approach as for foreign object detection. The resulting measurement spatial distribution will thus reflect the situation with only the power receiving device 105 being present, and the foreign object detector 219 may proceed to store this measurement spatial distribution as a reference spatial distribution. This reference spatial distribution may then subsequently be used as a reference spatial distribution.

It will be appreciated that the power transmitter 101 may potentially support a number of different power receiving devices and it may accordingly be able to store a plurality of reference spatial distributions. For example, the above described manual approach may be performed for a number of different power receiving devices resulting in a plurality of reference spatial distributions being stored. When performing subsequent foreign object detections, the foreign object detector 219 may compare the measurement spatial distribution to all of the stored reference spatial distributions to detect whether a close match is found.

In some embodiments, the foreign object detector 219 may alternatively or additionally be arranged to determine the reference spatial distribution in response to data received from the power receiving device 105.

In most wireless power transfer approaches, the system includes functionality for communicating data between the power receiver and the power transmitter (and often for bilateral communication). For example, the Qi specification allows for the power receiver to communicate data to the power transmitter by load modulating the power transfer signal. Alternatively or additionally, communication may be supported by dedicated communication functionality using e.g. separate communication coils. For example, in some scenarios the power transmitter and power receiver may communicate with each other using out-of-band communication, and may specifically use dedicated short range communication approaches.

Figure 6:
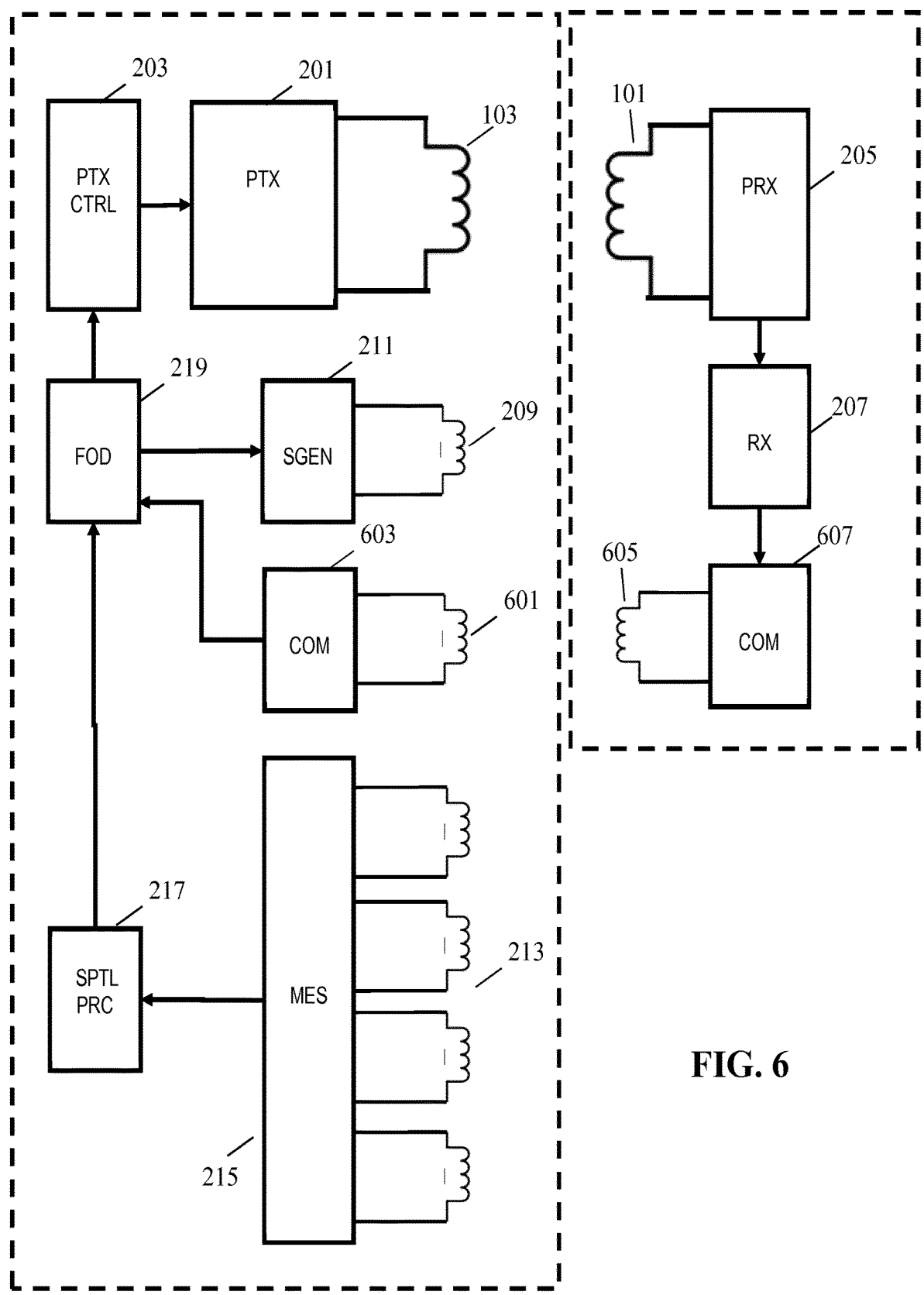
FIG. 6 illustrates an example of elements of a power transfer system in accordance with some embodiments of the invention.

FIG. 6 illustrates the system of FIG. 1 but further including such dedicated communication functionality. Specifically, the power transmitter 101 comprises a dedicated communication coil 601 and a communication unit 603. Similarly, the power receiving device 105 comprises a dedicated communication coil 605 and a communication unit 607. The two communication units 603, 607 can communicate data via signals exchanged using the two communication coils 601, 605. The communication may specifically be implemented using a standard short range communication signal, such as for example Bluetooth or Near Field Communication.

The power receiving device 105 may in such embodiments transmit data to the power transmitter 101 which allows this to generate the reference spatial distribution in response. In some embodiments, the power receiving device 105 may explicitly communicate data fully describing the reference spatial distribution. In other embodiments, the power receiving device 105 may communicate e.g. identification data allowing the power transmitter 101 to select a reference spatial distribution from e.g. a plurality of predetermined reference spatial distributions. Such predetermined reference distributions may e.g. be stored locally, or may e.g. be stored in a central server.

For example, whenever a new type of power receiving device is developed, the reference spatial distribution may be determined and by the manufacturer submitted to a central server which e.g. may be accessible via the Internet. The reference spatial distribution may be stored with an associated identity. When the power receiving device 105 subsequently is to be used with a power transmitter 101, it may communicate the identity to this. In response, the power transmitter 101 may access the central server using the received identity and may in this way retrieve a suitable reference spatial distribution to use for foreign object detection.

As another example, the power receiving device 105 may communicate a locally stored reference spatial distribution to the power transmitter whenever it detects the presence of a power transmitter 101 (or e.g. as part of the initialization of a power transfer operation).

Such approaches may be more efficient in some embodiments. Specifically, it may obviate the need for the power transmitter to locally store reference spatial distributions for all possible power receiving devices. It may further effectively support foreign object detection for new power receiving devices being developed and introduced to the market.

Thus, it will be appreciated that various approaches can be used for implementing the physical location to store the reference spatial distribution. A first option is to store it at the power transmitter. A second option is to store it at the power receiver. A third option is to store it at a storage service outside of the power transfer system (e.g. a server reachable via the Internet). It will also be appreciated that all of these options can be used independently of where the reference spatial distribution is generated, i.e. whether the reference spatial distribution is generated by the power transmitter, by a manufacturer of the power receiving device, etc. It will also be appreciated that combinations of such approaches may be used (e.g. with a central server providing most reference spatial distributions but with the power transmitter locally generating and storing reference spatial distributions for power receiving devices not represented in the central server).

As previously described, the comparison of the measurement spatial distribution and the reference spatial distribution may generally include a geometric alignment of the measurement spatial distribution and the reference spatial distribution. This alignment may be performed by applying a geometric transformation to either the measurement spatial distribution or the reference spatial distribution (or to both). The geometric transformation may include a translation and/or a rotation. In many embodiments, the geometric transformation may be determined by minimizing the difference between the measurement spatial distribution and the reference spatial distribution using a suitable minimization criterion. For example, the transformation resulting in the lowest square differences may be determined and applied in the comparison.

In some embodiments, the power transmitter 101 may furthermore comprise a user output unit, such as e.g. a display. In such cases, a user output may be generated on the basis of the geometric transformation.

For example, the reference spatial distribution may be generated to correspond to an optimal power transfer position for the power receiving device 105. As part of the comparison, the geometric transformation may be determined. The geometric transformation may specifically reflect a vector which the reference spatial distribution and measurement spatial distribution must be shifted relative to each other in order to minimize the difference between them (e.g. assuming that the power receiver magnetic image pattern is rotationally invariant). However, in such cases, the vector will also provide a good indication of the offset between the current position of the power receiving device 105 and the optimal position of the power receiving device 105 (from a power transfer point of view). Accordingly, the foreign object detector 219 may control the output display to indicate a vector indicating how the power receiving device 105 should be moved to achieve optimum power transfer.

In the previous examples, the foreign object detection has been based on only a single measurement spatial distribution (and reference spatial distribution). However, it will be appreciated that in other embodiments, the detection may be based on a plurality of sets of measurements.

Specifically, in some embodiments the power transmitter 101 may be arranged to perform the described operation for a plurality of different frequencies of the test signal. Specifically, the test signal may be a periodic signal which is active for a certain time duration. During this interval, the test signal thus has a given repetition frequency. For example, during the test time interval, a sine wave or square wave signal may be generated and the resulting induced voltages in the detection coils 213 measured.

In some embodiments, this approach may be repeated for the test signal (and thus the magnetic test signal) having different frequencies. For each frequency, a measurement spatial distribution may be generated and compared to a reference spatial distribution. The foreign object detection may be based on a plurality of these comparisons. For example, for each frequency, a difference measure may be generated indicating the difference between the measurement spatial distribution and the reference spatial distribution. A combined difference measure may then be determined, e.g. by averaging or summing the individual difference measures. If this combined difference measure exceeds a threshold, the foreign object detector 219 may indicate that a foreign object has been detected and otherwise it will indicate that no foreign object has been detected.

Thus, in some embodiments, the test signal generator may be arranged to generate a plurality of test signals with different frequencies resulting in a plurality of magnetic test signals with different frequencies. For each of these test signals, the measurement unit may generate a set of measurement values thereby generating a plurality of sets of measurement values. For each set of measurement values, a measurement spatial distribution may subsequently be generated.

The foreign object detector may then determine the foreign object detection estimate based on a plurality of comparisons, each comparison being between a measurement spatial distribution of the plurality of measurement spatial distributions and a reference spatial distribution. The reference spatial distributions may in many embodiments vary for different frequencies thereby reflecting the variations in the reference scenario due to varying frequencies.

Such an approach may in many embodiments and scenarios provide improved performance. In particular, the influence of metal objects on the magnetic field may typically depend on the frequency of the field (and thus of the test signal). Accordingly, making additional measurements at different frequencies provides additional information that may result in an improved detection performance.

In some embodiments, the measurement unit 215 may be arranged to perform the measurements of the induced voltages simultaneous for all of the detection coils 213. Thus, a parallel measurement operation may be performed.

However, the approach does not rely on or require that the measurements are necessarily simultaneous. Rather, in some embodiments the measurement unit 215 may generate the set of measurement values by sequentially measuring induced signals of the plurality of spatially distributed detection coils. The sequential measuring comprises separately measuring subsets of the plurality of spatially distributed detection coils. For example, the set of measurement values may be generated by the same measurement circuit sequentially, one-by-one, separately measuring the voltage of a detection coil 213. In some embodiments, a plurality of parallel measurement units may be used and thus the sequential measurement may include e.g. two detection coils 213 in each iteration.

This may in many embodiments allowed reduced complexity of the power transmitter 101 thereby resulting in reduced cost. In particular, it may in many embodiments reduce the amount of measurement hardware required.

It will be appreciated that the above description for clarity has described embodiments of the invention with reference to different functional circuits, units and processors. However, it will be apparent that any suitable distribution of functionality between different functional circuits, units or processors may be used without detracting from the invention. For example, functionality illustrated to be performed by separate processors or controllers may be performed by the same processor or controllers. Hence, references to specific functional units or circuits are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units, circuits and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements, circuits or method steps may be implemented by e.g. a single circuit, unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc. do not preclude a plurality. Reference signs in the claims are provided merely as a clarifying example shall not be construed as limiting the scope of the claims in any way.

The invention claimed is:

1. A power transmitter for a wireless power transfer system including a power receiver for receiving a power transfer from the power transmitter via a wireless inductive power transfer signal; the power transmitter comprising:
   a power output circuit comprising a transmit power coil for generating the wireless inductive power transfer signal;
   a test signal coil for generating a magnetic test signal;
   a test signal generator coupled to the test signal coil and arranged to feed a test signal to the test signal coil resulting in the generation of the magnetic test signal;
   a plurality of spatially distributed detection coils;
   a measurement unit for generating a set of measurement values reflecting signals induced in the spatially distributed detection coils by the magnetic test signal;
   a processor for determining a measurement spatial distribution of the measurement values, the spatial distribution reflecting positions of the detection coils; and
   a foreign object detector arranged to detect a presence of a foreign object in response to a comparison of the measurement spatial distribution to a reference spatial distribution, wherein the foreign object detector is arranged to determine the reference spatial distribution in response to data received from the power receiving device.

2. A power transmitter for a wireless power transfer system including a power receiver for receiving a power transfer from the power transmitter via a wireless inductive power transfer signal; the power transmitter comprising:
   a power output circuit comprising a transmit power coil for generating the wireless inductive power transfer signal;
   a test signal coil for generating a magnetic test signal;
   a test signal generator coupled to the test signal coil and arranged to feed a test signal to the test signal coil resulting in the generation of the magnetic test signal;
   a plurality of spatially distributed detection coils;
   a measurement unit for generating a set of measurement values reflecting signals induced in the spatially distributed detection coils by the magnetic test signal;
   a processor for determining a measurement spatial distribution of the measurement values, the spatial distribution reflecting positions of the detection coils; and
   a foreign object detector arranged to detect a presence of a foreign object in response to a comparison of the measurement spatial distribution to a reference spatial distribution, wherein the foreign object detector is arranged to geometrically align the measurement spatial distribution and the reference spatial distribution by performing a geometric transformation of at least one of the measurement spatial distribution and the reference spatial distribution prior to the comparison.

3. The power transmitter of claim 1 wherein the reference spatial distribution represents a scenario with no foreign object present.

4. The power transmitter of claim 1 wherein the reference spatial distribution represents a scenario with a power receiving device present.

5. The power transmitter of claim 1 wherein the foreign object detector is arranged to store a copy of the measurement spatial distribution, and to use the stored measurement spatial distribution as the reference spatial distribution for future comparisons.

6. The power transmitter of claim 2 wherein the geometric transformation includes at least one of a translation and a rotation.

7. The power transmitter of claim 1 further comprising a user output unit, and wherein the foreign object detector is arranged to generate a user output of an indication of a parameter of the geometric transformation.

8. The power transmitter of claim 1 wherein the measurement unit is arranged to generate a plurality of sets of measurement values for different frequencies of the magnetic test signal, the processor is arranged to generate plurality of measurement spatial distributions by generating a measurement spatial distribution for each set of measurement values, and the foreign object detector is arranged to detect the presence of the foreign object in response to comparisons of the plurality of measurement spatial distributions to at least one reference spatial distribution.

9. The power transmitter of claim 1 wherein at least some of the plurality of spatially distributed detection coils has a maximum dimension not exceeding 20 mm and the plurality of spatially distributed detection coils comprises no less than 20 detection coils.

10. The power transmitter of claim 1 wherein the measurement unit is arranged to generate the set of measurement values by sequentially measuring induced signals of the plurality of spatially distributed detection coils, the sequential measuring comprising separately measuring subsets of the plurality of spatially distributed detection coils.

11. A wireless power transfer system comprising a power transmitter and a power receiving device for receiving a power transfer from the power transmitter via a wireless inductive power signal; the power transmitter comprising:
   a power output circuit comprising a transmit power coil for generating the wireless inductive power transfer signal;
   a test signal coil for generating a magnetic test signal;
   a test signal generator coupled to the test signal coil and arranged to feed a test signal to the test signal coil resulting in the generation of the magnetic test signal;
   a plurality of spatially distributed detection coils;
   a measurement unit for generating a set of measurement values reflecting signals induced in the spatially distributed detection coils by the magnetic test signal;
   a processor for determining a measurement spatial distribution of the measurement values, the spatial distribution reflecting positions of the spatially distributed detection coils; and
   a foreign object detector arranged to detect a presence of a foreign object in response to a comparison of the measurement spatial distribution to a reference spatial distribution, wherein the foreign object detector is arranged to geometrically align the measurement spatial distribution and the reference spatial distribution by performing a geometric transformation of at least one of the measurement spatial distribution and the reference spatial distribution prior to the comparison.

12. A wireless power transfer system comprising a power transmitter and a power receiving device for receiving a power transfer from the power transmitter via a wireless inductive power signal; the power transmitter comprising:
   a power output circuit comprising a transmit power coil for generating the wireless inductive power transfer signal;
   a test signal coil for generating a magnetic test signal;
   a test signal generator coupled to the test signal coil and arranged to feed a test signal to the test signal coil resulting in the generation of the magnetic test signal;
   a plurality of spatially distributed detection coils;
   a measurement unit for generating a set of measurement values reflecting signals induced in the spatially distributed detection coils by the magnetic test signal;
   a processor for determining a measurement spatial distribution of the measurement values, the spatial distribution reflecting positions of the spatially distributed detection coils; and
   a foreign object detector arranged to detect a presence of a foreign object in response to a comparison of the measurement spatial distribution to a reference spatial distribution,
   wherein the power receiving device is arranged to transmit the reference spatial distribution to the power transmitter and the power transmitter is arranged to receive the reference spatial distribution from the power receiving device.

13. A method of operation for a wireless power transfer system comprising a power transmitter and a power receiving device for receiving a power transfer from the power transmitter via a wireless inductive power signal; the power transmitter comprising:
   a power output circuit comprising a transmit power coil for generating the wireless inductive power transfer signal;
   a test signal coil for generating a magnetic test signal;
   a plurality of spatially distributed detection coils;
   and the method comprising the power transmitter performing the steps of:
   feeding a test signal to the test signal coil resulting in the generation of the magnetic test signal;
   generating a set of measurement values reflecting signals induced in the spatially distributed detection coils by the magnetic field signal;
   determining a measurement spatial distribution of the measurement values, the spatial distribution reflecting positions of the detection coils; and
   detecting a presence of a foreign object in response to a comparison of the measurement spatial distribution to a reference spatial distribution, wherein the comparison comprises geometrically aligning the measurement spatial distribution and the reference spatial distribution by performing a geometric transformation of at least one of the measurement spatial distribution and the reference spatial distribution prior to the comparison.

14. A method of operation for a wireless power transfer system comprising a power transmitter and a power receiving device for receiving a power transfer from the power transmitter via a wireless inductive power signal; the power transmitter comprising:
   a power output circuit comprising a transmit power coil for generating the wireless inductive power transfer signal;
   a test signal coil for generating a magnetic test signal;
   a plurality of spatially distributed detection coils;
   and the method comprising the power transmitter performing the steps of:
   feeding a test signal to the test signal coil resulting in the generation of the magnetic test signal;
   generating a set of measurement values reflecting signals induced in the spatially distributed detection coils by the magnetic field signal;
   determining a measurement spatial distribution of the measurement values, the spatial distribution reflecting positions of the detection coils; and
   detecting a presence of a foreign object in response to a comparison of the measurement spatial distribution to a reference spatial distribution, and further comprising the steps of the power receiving device transmitting the reference spatial distribution to the power transmitter and the power transmitter receiving the reference spatial distribution from the power receiving device.

15. A method of operation for a power transmitter of a wireless power transfer system also comprising a power receiving device for receiving a power transfer from the power transmitter via a wireless inductive power signal; the power transmitter comprising:
   a power output circuit comprising a transmit power coil for generating the wireless inductive power transfer signal;
   a test signal coil for generating a magnetic test signal;
   a test signal generator coupled to the test signal coil and arranged to feed a test signal to the test signal coil resulting in the generation of the magnetic test signal;
   a plurality of spatially distributed detection coils;

a measurement unit for generating a set of measurement values reflecting signals induced in the spatially distributed detection coils by the magnetic test signal;

a processor for determining a measurement spatial distribution of the measurement values, the spatial distribution reflecting positions of the detection coils; and a foreign object detector arranged to detect a presence of a foreign object in response to a comparison of the measurement spatial distribution to a reference spatial distribution, wherein the comparison comprises geometrically aligning the measurement spatial distribution and the reference spatial distribution by performing a geometric transformation of at least one of the measurement spatial distribution and the reference spatial distribution prior to the comparison.

* * * * *